(12) United States Patent
Bolz et al.

(10) Patent No.: US 7,019,579 B2
(45) Date of Patent: Mar. 28, 2006

(54) CIRCUIT ARRANGEMENT FOR RAPIDLY CONTROLLING IN PARTICULAR INDUCTIVE LOADS

(75) Inventors: Stephan Bolz, Pfatter (DE); Günter Lugert, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/712,639

(22) Filed: Nov. 13, 2003

(65) Prior Publication Data

US 2004/0130379 A1    Jul. 8, 2004

(30) Foreign Application Priority Data

Nov. 13, 2002    (DE) .............................. 102 52 827

(51) Int. Cl.
*H03K 17/14*    (2006.01)

(52) U.S. Cl. ................... 327/374; 327/427; 327/434

(58) Field of Classification Search ............. 327/374, 327/375, 376, 377, 427, 432, 433, 434, 437, 327/108

See application file for complete search history.

(56) References Cited

U.S. PATENT DOCUMENTS

| | | | | |
|---|---|---|---|---|
| 3,571,614 A | 3/1971 | Rolstead | ...................... | 307/202 |
| 3,763,418 A | 10/1973 | Beck et al. | ...................... | 321/45 |
| 4,095,179 A | 6/1978 | Bremer et al. | ............... | 324/207 |
| 4,700,891 A | 10/1987 | Hans et al. | ............... | 239/132.5 |
| 4,866,298 A | 9/1989 | Kniss et al. | ................. | 307/268 |
| 4,931,940 A | 6/1990 | Ogawa et al. | ......... | 364/431.03 |
| 5,065,045 A | 11/1991 | Mok | .......................... | 307/355 |
| 5,656,969 A * | 8/1997 | Pulvirenti et al. | .......... | 327/561 |
| 5,752,482 A | 5/1998 | Roettgen et al. | ............ | 123/322 |
| 5,936,439 A | 8/1999 | Pollersbeck | .................. | 327/110 |
| 6,100,680 A | 8/2000 | Vig et al. | ................ | 324/207.2 |
| 6,181,171 B1 | 1/2001 | Graf et al. | .................... | 327/110 |
| 6,236,122 B1 * | 5/2001 | Maeda et al. | ................ | 307/125 |
| 6,351,162 B1 | 2/2002 | Schwartz | ..................... | 327/110 |
| 6,625,516 B1 * | 9/2003 | Niimi et al. | ................. | 700/170 |
| 6,666,090 B1 | 12/2003 | Mori et al. | .............. | 73/504.02 |
| 6,724,227 B1 * | 4/2004 | Imai | ........................... | 327/108 |
| 6,788,128 B1 * | 9/2004 | Tsuchida | ..................... | 327/427 |
| 6,804,096 B1 * | 10/2004 | Nagata | ........................ | 361/78 |
| 2002/0021150 A1 * | 2/2002 | Tuchiya et al. | ............. | 327/108 |
| 2004/0100150 A1 | 5/2004 | Bolz et al. | ................... | 307/116 |
| 2004/0196026 A1 | 10/2004 | Bolz | ..................... | 324/207.12 |

FOREIGN PATENT DOCUMENTS

| | | |
|---|---|---|
| DE | 2446193 | 7/1977 |
| DE | 3543058 | 6/1987 |
| DE | 4300882 | 7/1994 |
| DE | 4207371 | 8/1995 |

(Continued)

*Primary Examiner*—Tuan T. Lam
(74) *Attorney, Agent, or Firm*—Baker Botts L.L.P.

(57) ABSTRACT

A circuit arrangement for rapidly switching in particular inductive loads, comprises a load (11) being connectable to a supply voltage source (31) by means of a switching transistor(41) implemented as an N-channel MOS power transistor and connected as a high-side switch, a potential exceeding the voltage of the supply voltage source (31) being applicable to the gate electrode of the switching transistor (41) by controllable switching means, said switching means incorporating at least a first switching-means transistor (52) whose collector current can flow at least in part to the gate electrode of the switching transistor (41) during the conducting state. The first switching-means transistor (52) is connected as a current source. Furthermore, the first switching-means transistor (52) connected as a voltage source can be part of a current mirror circuit.

15 Claims, 4 Drawing Sheets

FOREIGN PATENT DOCUMENTS

| | | |
|---|---|---|
| DE | 196 09 121 C1 | 2/1997 |
| DE | 19707263 | 8/1998 |
| DE | 197 51 651 C1 | 2/1999 |
| DE | 19924113 | 4/2000 |
| DE | 10030485 | 1/2001 |
| EP | 0 330 823 | 1/1989 |
| EP | 0 415 081 A2 | 7/1990 |
| EP | 0 574 646 | 6/1992 |
| EP | 0 684 699 | 5/1994 |
| EP | 0973258 | 1/2000 |
| WO | 9116765 | 10/1991 |

* cited by examiner

CIRCUIT ARRANGEMENT FOR RAPIDLY CONTROLLING IN PARTICULAR INDUCTIVE LOADS

PRIORITY

This application claims foreign priority of the German application DE 10252827.6 filed on Nov. 13, 2002.

TECHNICAL FIELD OF THE INVENTION

The invention relates to a circuit arrangement for rapidly switching in particular inductive loads, a load being connectable to a supply voltage source by means of a switching transistor implemented as an N-channel MOS power transistor and connected as a high-side switch, a potential exceeding the voltage of the supply voltage source being applicable to the gate electrode of said switching transistor by controllable switching means and said switching means incorporating at least one first switching-means transistor whose collector current can flow at least in part to the gate electrode of the switching transistor in the conducting state.

BACKGROUND OF THE INVENTION

Circuit arrangements of this kind are used, for example, in automotive electronics where the operation of fast-switching, inductive loads by means of MOS power transistors is increasingly required. Typical applications include the control of electromagnetic injection valves for diesel or gasoline high-pressure direct injection systems, 3-phase frequency converters for operating electric motors/generators with electronic commutation, bidirectional DC/DC converters or electromagnetic valve operation.

In these applications, MOS power transistors are often used as switches. Depending on the doping of the transistor substrate and of its channels, a distinction is drawn between N and P-channel transistors, an N-channel transistor having n-doped regions in a p-doped substrate. In terms of circuit technology, it is particularly advantageous to implement so-called low-side switches, i.e. those which are essentially assigned to a load on the ground side, using N-channel transistors, and to implement so-called high-side switches, i.e. those which are essentially assigned to a load on the positive potential side, using P-channel transistors. This makes the required circuits particularly simple. However, for technological reasons, P-channel transistors have approximately twice the saturation resistance of an otherwise comparable N-channel transistor. In order therefore to implement a P-channel transistor with a predefined saturation resistance, approximately twice the chip area is required compared to a corresponding N-channel transistor. The associated costs are broadly proportional to the chip area required.

Attempts are therefore being made to implement even high-side switches with N-channel transistors, the main problem being that an N-channel transistor only becomes conducting between drain and source in the event of a positive gate voltage. In the case of a high-side switch, however, positive means higher than the positive potential at which conduction is to take place. Therefore, if e.g. in the case of controlling an injection valve the latter's coil is connected to the +48 V supply voltage of the vehicle electrical system, the gate voltage of an N-channel transistor used as a switch must be higher than this supply voltage. Various principles for solving this problem are known.

One possibility is the so-called charge pump whereby a small alternating voltage, preferably a square-wave control voltage, is clamped after capacitive decoupling with respect to the supply voltage, then rectified in a rectifier cascade comprising diodes and parallel capacitors and amplified. This type of voltage multiplier will be known to a person skilled in the art. A particularly favorable embodiment for controlling high-side switches has been realized e.g. in Infineon's BTS410 intelligent high-side switch. Although this principle enables high voltages to be generated in a simple and cost-effective manner, the current handling capacity of a voltage source produced in this way using a charge pump is mostly low. However, because of the gate capacitance, it is this high current flow to the gate electrode that is essential in order to enable fast switching of the MOS power transistor. The charge pump principle is therefore suitable primarily for slow-switching applications.

Figure 2:
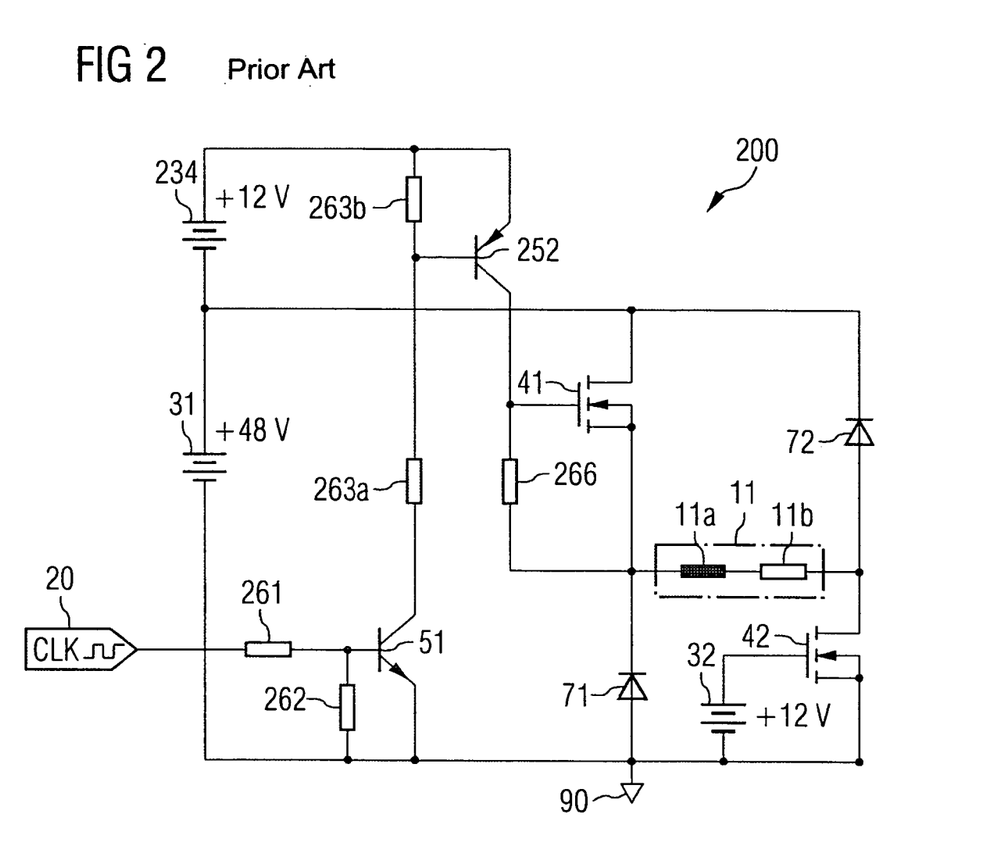
FIG. 2 shows a circuit arrangement according to the prior art that can be used as an alternative to the circuit arrangement shown in FIG. 1.

The problem can be solved in a basically relatively simple way by connecting an additional auxiliary voltage source whose negative terminal is applied to the positive potential of the supply voltage. This can be implemented, for example, by means of a DC/DC boost converter or in some other manner that will be familiar to a person skilled in the art. This high potential is then applied to the gate electrode via suitable switching means including e.g. a pnp switching-means transistor whose emitter is at the potential of the raised auxiliary voltage source and whose collector is connected to the gate electrode of the MOS power transistor, the base of the switching-means transistor being suitably driven by a control voltage. This circuit is suitable for delivering high currents, thereby enabling fast switching of the MOS power transistor. Because of the auxiliary voltage source required, which is raised above the supply potential and can therefore only be used for the explained purpose, the circuit described is expensive and only becomes economically viable when used for a plurality of high-side switches. Moreover, in order to also guarantee rapid turn-off, i.e. to ensure rapid draining away of the charge stored by the gate capacitor, additional circuitry must be operated. FIG. 2 shows a block diagram.

Figure 3:
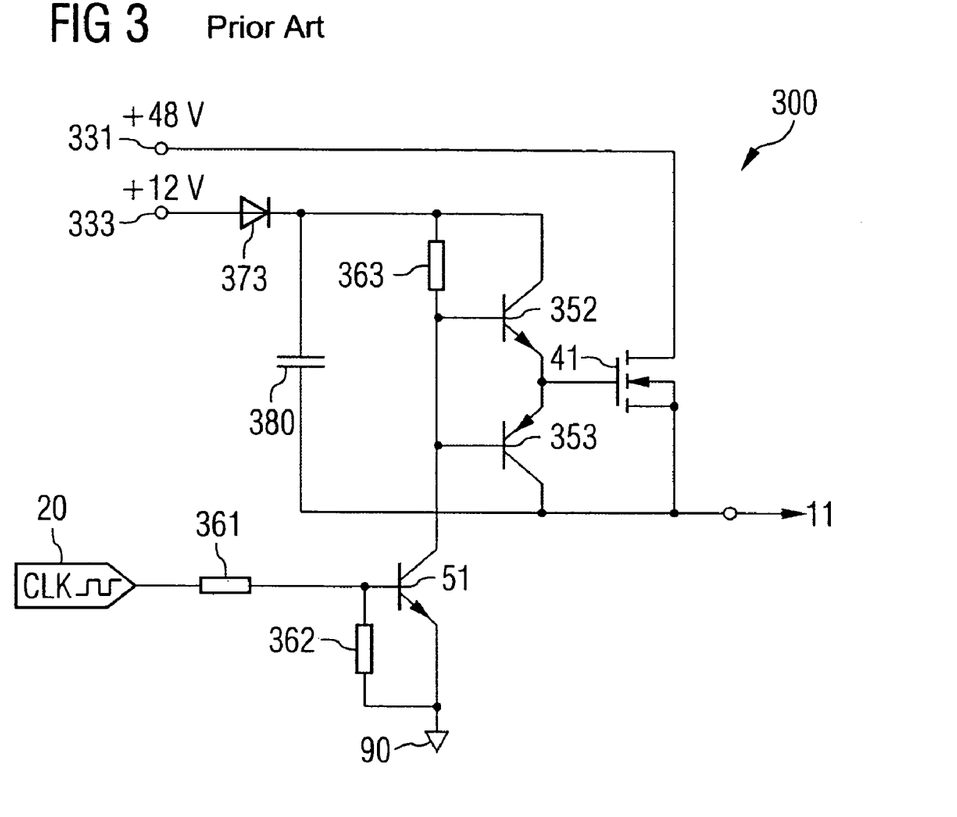
FIG. 3 shows a block diagram of a bootstrap circuit according to the prior art.

Another known arrangement for generating the high gate voltage of a high-side switch implemented as an N-channel transistor is the so-called bootstrap circuit whereby a low-voltage source, i.e. in this context a voltage source whose output voltage is much lower than the positive supply voltage, e.g. a 12 V source, which is generally present in a motor vehicle in addition to the 48 V supply voltage for supplying the general drive and control electronics, is coupled via a diode into a network having at least one switching-means transistor whose collector current can flow to the gate electrode of the MOS power transistor. A capacitor is provided in parallel therewith and connected to the source output of the MOS power transistor. In the off state, it basically charges up to the voltage of the low voltage source. If the switching-means transistor is then driven so that it connects the gate electrode to the low voltage source, the MOS power transistor begins to conduct, its source potential beginning to rise in the direction of the supply voltage. However, as the source electrode is connected to the negative pole of the capacitor, its voltage is also raised. As soon as it exceeds the voltage of the low voltage source, its charge flows via the switching-means transistor to the gate electrode, as the diode prevents it from flowing back into the low voltage source. In this way source and gate potential increase equally, their difference being approximately maintained. The MOS power transistor can therefore turn fully on. The capacitor can deliver a high current for a short period, thereby ensuring fast switching. The disadvantage, however, is that the current decays relatively quickly even with a high-value capacitor, so that lasting turn-on of the MOS power transistor is not possible with this circuit. There exist integrated driver circuits for operating high-side switches which are suitable for bootstrap supply, e.g. IC IR2122(S) from International Rectifier. FIG. 3 shows a block diagram.

The main disadvantage of the circuit arrangements according to the prior art is that the switching edges, i.e. basically the switching rate, is only adjustable to a very limited extent. This is disadvantageous because, for fast switching processes, a balanced compromise must always be found between excessively slow switching on the one hand, resulting in heating of the transistors and therefore increased switching losses, and excessively rapid switching on the other, resulting in an increased electromagnetic interference level. Typically the room for maneuver between these two contrary requirements is very small, so that a very precise examination of the switching times would be desirable.

SUMMARY OF THE INVENTION

The object of the present invention is to provide a circuit arrangement overcoming the stated problems of the prior art, in particular specifying an inexpensive arrangement which can be implemented without complex circuitry and which allows a high-side switch implemented as an N-channel MOS power transistor to be rapidly switched on and off. It is another object of the present invention to further develop a generic circuit arrangement in such a way that the switching times of the MOS power transistor are adjustable over a wide range.

These objects can be achieved by a circuit arrangement for rapidly switching a load, in particular an inductive load, comprising a switching transistor implemented as an N-channel MOS power transistor and connected as a high-side switch for connecting a load with a supply voltage, and controllable switching means for applying a potential exceeding the voltage of the supply voltage source to the gate electrode of the switching transistor, wherein said switching means incorporate at least a first switching-means transistor whose collector current can flow at least in part to the gate electrode of the switching transistor during the ON state, and wherein the first switching-means transistor is connected as a current source.

The first switching-means transistor connected as a current source can be part of a current mirror circuit. The current mirror circuit additionally may incorporate a first current mirror resistor and a second current mirror resistor each connected to a low voltage source on the one hand and the first current mirror resistor being connected to the base electrode and the current mirror resistor being connected to the emitter electrode of the first switching-means transistor on the other. The first switching-means transistor can be a pnp transistor. The collector current of the first switching-means transistor may flow to the gate electrode of the switching transistor via a diode connected in the flow direction. The ratio of the resistance values of the first current mirror resistor and the second current mirror resistor may correspond to approximately 100:1. An input current of the current mirror circuit can be controllable by means of a second switching-means transistor connected as a current source and clocked by a control signals. The input current of the current mirror may flow to the latter via an RC element comprising an RC element resistor and a parallel-connected RC element capacitor. The time constant of the RC element can be so designed that the RC element-capacitor is not charged significantly during the turn-on time of the switching transistor, but virtually completely charged during its ON time. The current mirror circuit further may include a diode connected in series with the first current mirror resistor in and in the flow direction of the current mirror input current. A bootstrap capacitor can be provided which is connected to the low voltage source on the one hand and to the source electrode of the switching transistor on the other. A bootstrap diode oriented in the forward direction for coupling the voltage of the low voltage source into the current mirror circuit may be provided. The low voltage source may have an auxiliary voltage source sitting on top of the potential of the supply voltage. A third switching-means transistor can be provided whose emitter electrode is connected to the gate electrode of the switching transistor and whose collector electrode is connected via a leakage resistor to the source electrode of the switching transistor. The base electrode of the third switching-means transistor can be connected via a leakage resistor to the source electrode of the switching transistor. The third switching-means transistor can be a pnp transistor. The diode via which the collector current of the first switching-means transistor flows to the gate electrode of the switching transistor can be disposed between the collector of the first switching-means transistor and the emitter of the second switching-means transistor.

The objects can also be achieved by a method for rapidly switching a load, in particular an inductive load, comprising the steps of:

connecting a load via a switching transistor implemented as an N-channel MOS power transistor with a supply voltage, applying a potential exceeding the voltage of the supply voltage source to the gate electrode of the switching transistor through switching means, wherein said switching means incorporate at least a first switching-means transistor whose collector current can flow at least in part to the gate electrode of the switching transistor during the ON state, and wherein the first switching-means transistor is connected as a current source.

The collector current of the first switching-means transistor may flow to the gate electrode of the switching transistor via a diode connected in the flow direction. The method may further comprise the step of providing a third switching-means transistor whose emitter electrode is connected to the gate electrode of the switching transistor and whose collector electrode is connected via a leakage resistor to the source electrode of the switching transistor.

The invention is based on the generic circuit arrangement according to FIG. 2 in that the switching-means transistor is connected as a power source. Through this measure, the invention overcomes the dependence on current densities which are supplied by a constant voltage source as a function of the network parameters. The required current density rather becomes an adjustable quantity with adaptable output voltage of the current source. As the current density is the actual critical variable for driving switching transistors, the present invention provides the basis for more precise adjustability of the switching processes than has been possible with the prior art.

In an advantageous development of the present invention, the first switching-means transistor connected as a current source, preferably a pnp transistor, is part of a current mirror circuit. Although there are different possibilities for implementing a current source using a transistor, the current mirror circuit is particularly favorable, as it enables the current density of the output current to be adjusted particularly easily and over a wide range, which means direct adjustability of the switching times of the MOS power transistor.

Advantageously the current mirror circuit is implemented in such a way that it additionally incorporates a first current mirror resistor and a second current mirror resistor each connected to a low voltage source on the one hand and the first current mirror resistor being connected to the base electrode and the second current mirror resistor being connected to the emitter electrode of the first switching-means transistor on the other. The ratio of the first to the second switching-means resistance therefore determines the current gain of the mirror circuit compared to a control current. In a particularly advantageous embodiment, the ratio of the first to the second current mirror resistance is set to approximately 100:1.

In a preferred development of the circuit arrangement according to the invention, it is provided that the collector current of the first switching-means transistor flows to the gate electrode of the switching transistor via a diode connected in the flow direction. As a result, once the gate capacitor has been charged, the charge stored there cannot drain away elsewhere, which means that the switching transistor can remain turned on for longer.

Advantageously, an input current of the current mirror circuit is controllable by means of a second switching-means transistor connected as a current source and clocked by a control signal, it being particularly favorable if the input current of the current mirror flows to the latter via an RC element comprising a resistor and a parallel-connected capacitor. Here the time constant of the RC element is preferably implemented in such a way that the RC element capacitor is not substantially charged during the turn-on time of the switching transistor, but virtually completely charged during its ON time. This obviates the need for the overdriving of switching-means transistors necessary in conventional switching operation and the inherent associated turn-off delay of the switching transistor governed essentially by the switching times of the switching-means transistors.

The control signal is preferably a square-wave voltage generated by a microcontroller. In this way its shape is particularly well adaptable to the relevant requirements, especially in respect of the switching instants.

In addition, the current mirror circuit advantageously incorporates a diode connected in series with the first current mirror resistor and in the flow direction of the current mirror input current. This is implemented in such a way that it prevents current flow from the base to the emitter of the first switching-means transistor, but permits a current mirror circuit input current from the low voltage source to ground in the conducting state.

An advantageous embodiment of the circuit arrangement according to the invention consists in providing a bootstrap capacitor which is connected to the low voltage source on the one hand and to the source electrode of the switching transistor on the other. This means that when the switching transistor is connected by its drain electrode to the positive supply voltage, the capacitor is charged with the voltage of the low voltage source of the switching transistor during the nonconducting state of the switching transistor. When the switching transistor, driven by the switching-means transistor connected as a current source, begins to conduct, the capacitor voltage is raised with the increasing source potential of the switching transistor, thereby increasing the voltage of the current source above the supply voltage. This development is suitable for intermittent switching of the switching transistor (PWM operation, pulse width modulation).

As an alternative to the bootstrap circuit, the circuit arrangement according to the invention can also be equipped with an auxiliary voltage source basically known from the prior art, which sits on top of the potential of the supply voltage. This type of circuit is appropriate, for example, if the high-side switch is to be operated quasi-statically, i.e. the capacitance of the bootstrap capacitor is inadequate to ensure a sufficiently long ON time of the switching transistor. Even in the case of simultaneously employing a plurality of high-side switches, the use of an auxiliary voltage source above the supply voltage (e.g. 48 V) may be advantageous, as this only needs to be implemented singly for all the switches, whereas in the case of the bootstrap circuit each switch requires a diode and a capacitor.

In a preferred development of the invention there is provided a third switching-means transistor whose emitter electrode is connected to the gate electrode of the switching transistor and whose collector electrode is connected via a leakage resistor to the source electrode of the switching transistor. Its base electrode is simultaneously connected via another leakage resistor to the source electrode of the switching transistor. In the OFF state of the switching transistor, this third switching-means transistor is rendered conducting, so that no voltage is present between the source and gate of the switching transistor and the latter is held reliably OFF. The third switching-means transistor is preferably a pnp transistor.

If, as in a particularly preferred embodiment of the present invention, the aforementioned diode via which the collector current of the first switching-means transistor flows to the gate electrode of the switching transistor is advantageously disposed between the collector of the first and the emitter of the second switching-means transistor, the third switching-means transistor is held reliably OFF because of the voltage drop across this diode in the ON state of the switching transistor.

To couple the voltage of the low voltage source into the current mirror circuit, there is preferably provided a bootstrap diode oriented in the flow direction. Although this enables current to flow from the low voltage source, it inhibits current in the opposite direction when the voltage of the bootstrap capacitor rises above the potential of the low voltage source when the switching transistor is turned on.

BRIEF DESCRIPTION OF THE DRAWINGS

The invention will now be explained with reference to the accompanying drawings based on the example of preferred embodiments.

DETAILED DESCRIPTION OF THE PREFERRED EMBODIMENTS

Figure 1A:
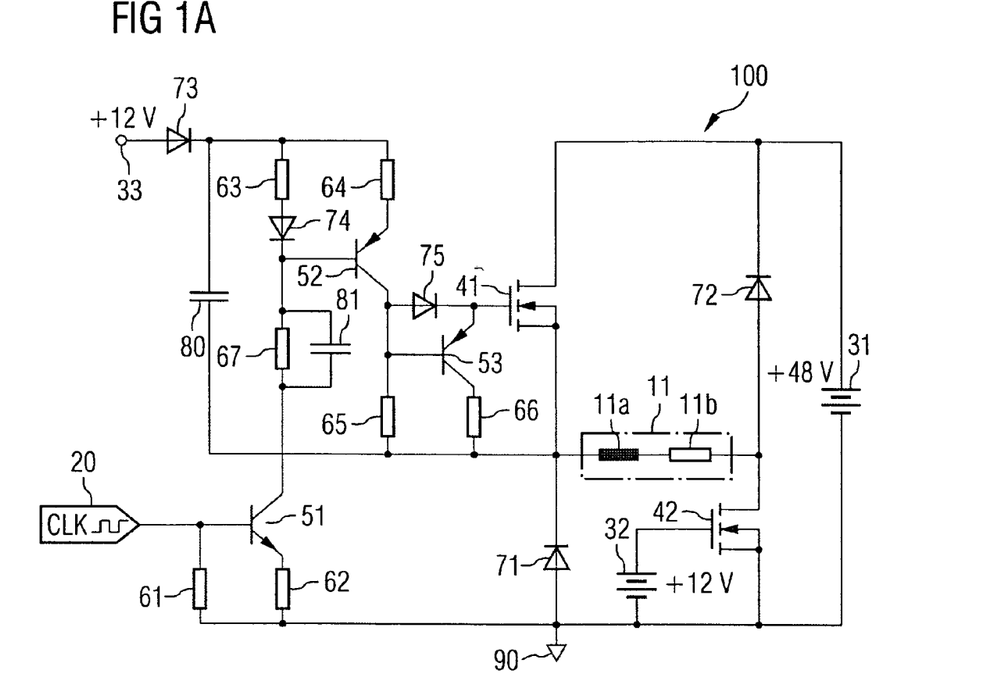
FIG. 1a shows a circuit arrangement according to the invention with bootstrap for driving an inductive load.

FIG. 1a illustrates a circuit arrangement 100 according to a particularly preferred exemplary embodiment of the invention for driving an electromagnetic injection valve 11, depicted as a series circuit comprising the actual coil inductor 11a, e.g. 150 µH of the electromagnet and the winding resistor 11b, e.g. 0.5 Ω. The valve 11 can be loaded by a voltage supply 31 with a voltage of e.g. 48 V clocked by a control signal 20 implemented as a square-wave voltage, said signal advantageously originating from a microcontroller (not shown). The switching transistor 41 implemented as an N-channel MOS power transistor and connected on the high side is used as the switch. The control clock is injected into the network via switching means incorporating a switching-means transistor 51. The circuit arrangement is part of an extended drive of 16 valves in an internal combustion engine. The valve 11 is selected via a selecting transistor 42, preferably likewise a MOS power transistor, implemented as an N-channel transistor but connected as a low-side switch. The selecting transistors 42 is driven via switching means (not shown in further detail) which are supplied by the +12 V supply voltage of the other drive and control electronics (not shown).

Identically functioning components are also identified by the same reference characters in the circuit in FIG. 2 which represents a generic arrangement. To facilitate understanding, two arrangements according to the prior art will first be described followed by the characteristic features of the circuit arrangement according to the invention.

Reference is made to FIG. 2. The valve 11 is selected by turning on the selecting transistors 42. The turn-on of the switching transistor 41 to apply the supply voltage to the valve 11 is controlled by the control signal 20. If the control signal has Low level or the output of the preferably used microcontroller is high-impedance (tristate), the base of the switching-means transistor 51 is connected to ground 90 via the switching-means resistors 261 and 262. The switching-means transistor 51, preferably implemented as an npn transistor and whose emitter is likewise connected to ground, is therefore nonconducting. The other switching-means transistor 252 whose base terminal is connected to an additional auxiliary voltage of e.g. +12 V which sits on top of the positive potential of the +48 V supply voltage, is also nonconducting. No current therefore flows through the leakage resistor 266, with the result that the gate voltage of the switching transistor 41 is 0 V and the latter is likewise nonconducting.

If, on the other hand, the control signal 20 has High level, the switching-means transistor 51 is driven to conduction via the switching-means resistor 261. A current then flows through the other switching-means resistors 263a and 263b, causing the switching-means transistor 252 to conduct because of the voltage drop across the resistor 263b. A current also flows through the leakage resistor 266, causing the gate-source voltage of the switching transistor 41 to increase. The transistor 41 turns on.

With the turn-on of the switching transistor 41, an increasing current flows through the valve inductor 11a. Due to the small inductance of the valve coil, e.g. 15 µH, and the high supply voltage of 48 V, the current increases very quickly. If the current reaches a specific value, e.g. 20 A, the valve opens. This is referred to as the inrush current of the valve. If the switching transistor 41 turns off, the coil current flows, driven on by the coil inductor 11a via the free-wheeling diode 71 and slowly decays because of the low diode resistance, the valve initially remaining open. By turning the switching transistor 41 periodically on and off, an average holding current can thus be produced in the valve coil.

To close the valve 11, switching and selecting transistor 41 and 42 are turned off. The current stored in the coil inductor 11a flows via the diodes 71 and 72. As a result of the high back EMF of +48 V, the current decays very quickly, i.e. the valve closes quickly.

The known arrangement produces very high electromagnetic interference levels. Due to the large variation in the gate-drain voltage when the switching transistor 41 switches, its gate-drain capacitance appears to be increased according to the so-called Miller Effect. In conjunction with the available gate charging and discharging currents, the value of this capacitance critically determines the switching times of the transistor 41 in the circuit according to the prior art. For turn-on, a relatively large charging current flows into the gate, e.g. 500 mA. Its value is essentially determined by the base current at the switching-means transistor 252, its current gain factor and its current carrying capacity. The turn-on time, e.g. approx. 59 ns is correspondingly short. This produces the abovementioned EMC interference level.

For turn-off, the gate capacitance of the switching transistor 41 is discharged via the leakage resistor 266. As during the ON state this value additionally loads the auxiliary voltage source 234, its value must be selected correspondingly high, e.g. 100 Ω. However, at the operating point of the switching transistor 41, e.g. at a gate-source voltage of 5 V, this means a discharging current of only 50 mA, resulting in a correspondingly long turn-off time. This considerably increases the power switching losses.

FIG. 3 depicts a so-called bootstrap circuit according to the prior art which is likewise suitable e.g. for controlling an injection valve 11 (not shown). Drive is applied via a switching transistor 41 which is clocked by a control voltage 20 via the switching-means resistors 361, 362, 363 and switching-means transistors 51, 352 and 353. Components with the same or similar functions are identified by the same reference characters as in FIG. 2 or have the same last two digits in the case of three-digit reference characters.

In so far as the mode of operation of the circuit in FIG. 3 is no different from that in FIG. 2, it will not be described again. The operation of the additional switching-means transistor 353 will be evident from the circuit to a person skilled in the art and, moreover, is not relevant to the explanation of the bootstrap circuit.

The main components of the bootstrap circuit are the bootstrap capacitor 380 and the bootstrap diode 373. During the OFF state of the switching transistor 41, the capacitor 80 is charged via the low voltage source 333 which can be e.g. the 12 V supply voltage already available in the motor vehicle for supplying the general drive and control electronics, and the ground-connected valve 11. As the negative pole of the capacitor 380 is connected to the source terminal of the switching transistor 41, its potential is increased as soon as the transistor 41 begins to conduct and its source voltage rises towards the +48 V supply voltage. Because of the bootstrap diode 373, the capacitor charge cannot drain away to the low voltage source 333 if the capacitor voltage is raised above the e.g. 12 V of the low voltage source 333. In this way the gate voltage of the switching transistor 41 increases, as it switches, to beyond the supply voltage, enabling the switching transistor 41 to turn fully on. However, the capacitor 80 can only deliver current for a short time, so that this circuit does not permit long-lasting turn-on of the switching transistor 41.

FIG. 1a illustrates the circuit arrangement according to the invention in a particularly preferred embodiment. As may be clearly seen, the load section of the arrangement, the valve 11 to be controlled, the 48 V voltage supply 31, the 12 V voltage supply 32, switching transistor 41, selecting transistor 42, free-wheeling diode 71 and ground 90 is incorporated unchanged compared to the prior art, which is also indicated by the identical reference characters. The switching means for coupling in the control signal 20, comprising the switching-means resistors 61 and 62 as well as the switching-means transistor 51, have been modified compared to the arrangement in FIG. 2. However, to explain the essence of the present invention, only its analogous mode of operation using the corresponding components 20, 261, 262, 51 in circuit 20 will first be considered, which is reflected in the identical or similar reference characters. See below for a detailed description of its operation.

The circuit 100 has no additional auxiliary voltage source sitting on top of the 48 V supply voltage. Instead it is sufficient to provide the 12 V voltage source 33 already present in the motor vehicle which can be identical to the voltage source 32. This can represent a considerable saving. In its place, a bootstrap capacitor 80 is used to achieve a voltage exceeding the supply potential. This variant is an obvious solution for the important case of PWM operation.

The negative terminal of the capacitor 80 is connected to the source terminal of the switching transistor 41. Its positive terminal is connected to the low voltage source 33 via a diode 73 disposed in the flow direction. If the switching transistor 41 is OFF, the capacitor 80 is charged to e.g. 12 V via the diode 73 as well as the valve 11 and the turned-on selecting transistor 42.

As long as the switching-means transistor 51 is nonconducting as the result of a high-impedance control voltage output (tristate) or a Low level control signal, no current can flow through the first current mirror resistor 63 and the diode 74. Nor does the switching-means transistor 52 receive any base current and the second current mirror resistor 64 and the leakage resistor 65 are likewise without current. The base potential of the switching-means transistor 53 is connected via the leakage resistor 65 to the source potential of the switching transistor 41, so that the switching-means transistor 53 becomes conducting and connects the gate terminal (without current) to the source terminal of the switching transistor 41 which is therefore reliably nonconducting.

If the switching-means transistor 51 is driven by the control signal 20 in such a way that it becomes conducting, a current flows through it which is determined by its voltage drop (e.g. 5 V–$V_{BE}$=4.3 V) and the size of the switching-means resistor 62, e.g. 1 mA. This current also flows through the diode 74 and the first current mirror resistor 63 which forms a current mirror in conjunction with the switching-means transistor 52 and the second current mirror resistor 64. Its output current is determined by the product of its input current just explained and the ratio of the current mirror resistors 63 and 64. If a ratio e.g. 100:1 is selected, a current mirror output current of theoretically 100 mA is obtained. However, because of the limited current gain of the transistor 52 and other interfering factors, it will in practice turn out to be somewhat smaller, e.g. 86 mA.

This current now flows to the gate of the switching transistor 41 which then begins to conduct. Simultaneously, because of the voltage drop across the leakage resistor 65, the switching-means transistor 53 is reliably nonconducting, so that no current flows through the leakage resistor 66. If e.g. a 1 kΩ leakage resistor 65 is selected, the current flow when the threshold voltage of the switching transistor 41 (e.g. 5 V) is achieved is 5 mA. Of the current mirror output current (86 mA), e.g. 81 mA is therefore available for charging up the gate capacitor. The rise time of the gate potential, i.e. essentially the ON time of the switching transistor 41, is determined, as mentioned above, by the gate capacitance and the charging current. The latter can be set over a wide range by means of variations in the ratio of the current mirror resistors 63 and 64, so that very good adjustability of the turn-on time is achieved by the invention.

Power is initially supplied to the current mirror from the low voltage source 33. However, as soon as the switching transistor 41 becomes conducting, and the voltage of the capacitor 80, in a similar manner to that already described in the context of the bootstrap circuit in FIG. 2, increases above the voltage source 33, the current mirror is fed from the capacitor 80. For dimensioning, care only has to be taken to ensure that the capacitance of the capacitor is sufficiently large, e.g. 10 μF, in order to ensure complete charging of the gate capacitor. If the switching transistor 41 is fully turned on, the voltage at the capacitor 80 is approximately 60 V e.g. for the aforementioned component values For turn-off, the control signal 20 is taken down to Low level again and the switching-means transistor 51 becomes nonconducting. The current mirror then no longer receives an input signal and is deenergized. The voltage drop across the leakage resistor 65 reduces accordingly and the switching-means transistor 53 becomes conducting, so that the gate capacitor is discharged via the leakage resistor 66. The discharging time and therefore essentially the turn-off time of the switching transistor 41 can be set by specially selecting the resistor 66. This means that, because of the invention, the turn-off time can also be varied over wide limits.

In the particularly advantageous embodiment of the circuit arrangement according to the invention shown in FIG. 1a, the second switching-means transistor 51 via which the input current of the current mirrors is clocked by the control signals 20 is connected as a current source. This raises the basic problem of long delay times for turning off the high-side switch, i.e. the time interval between a corresponding control edge of the control signal 20 and turn-off of the switching transistor 41 which is not only governed by the turn-off time of the switching transistor 41 itself, but also to a large extent by the switching times of the switching-means transistors. In conventional switching operation, overdriving of the transistors takes place, as a higher base current than is actually required to carry the collector current is used to compensate for any manufacturing tolerances in the current gain. The clearing of the correspondingly increased minority carriers from the base space-charge region during turn-off delays the process. This does not occur during operation as a current source, as only the base current necessary to maintain the collector current always flows.

Another measure for reducing the delay time is to feed the current mirror input current via an RC element comprising RC element resistor 67 and RC element capacitor 81 connected in parallel. Although the first switching-means transistor 52 is connected as a current source according to the invention, as soon as the gate voltage of the switching transistor 41 reaches and exceeds the supply voltage (48 V in the embodiment shown), the emitter-collector voltage of the switching-means transistor 52 goes to 0 V, making the current mirror ineffective and causing the collector current of the switching-means transistor 52 to fall and the gate charging current of the switching transistor 41 to return to zero. The remaining collector current of the switching-means transistor 52 is then determined by the leakage resistor 65. The base current of the switching-means transistor 52 which flows when the switching transistor 41 is conducting would now be much larger than is necessary to carry the collector current. The switching-means transistor 52 is therefore overdriven, resulting in increased turn-off delay. However, this can be prevented by the RC element if its time constant τ=RC is so designed that the RC element capacitor 81 is not significantly charged during the turn-on time of the switching transistor 41, but virtually completely charged during its ON time. During turn-on of the switching transistor 41, the current mirror input current is determined by the voltage source from the second switching-means transistor 51 and switching-means resistor 62. As the RC element-capacitor 81 is increasingly charged, the voltage across the RC element resistor 67 increases until saturation of the second switching-means capacitor 51, thereby reducing the drive current of the current mirror and preventing overdriving of the first switching-means transistor 52.

Figure 1B:
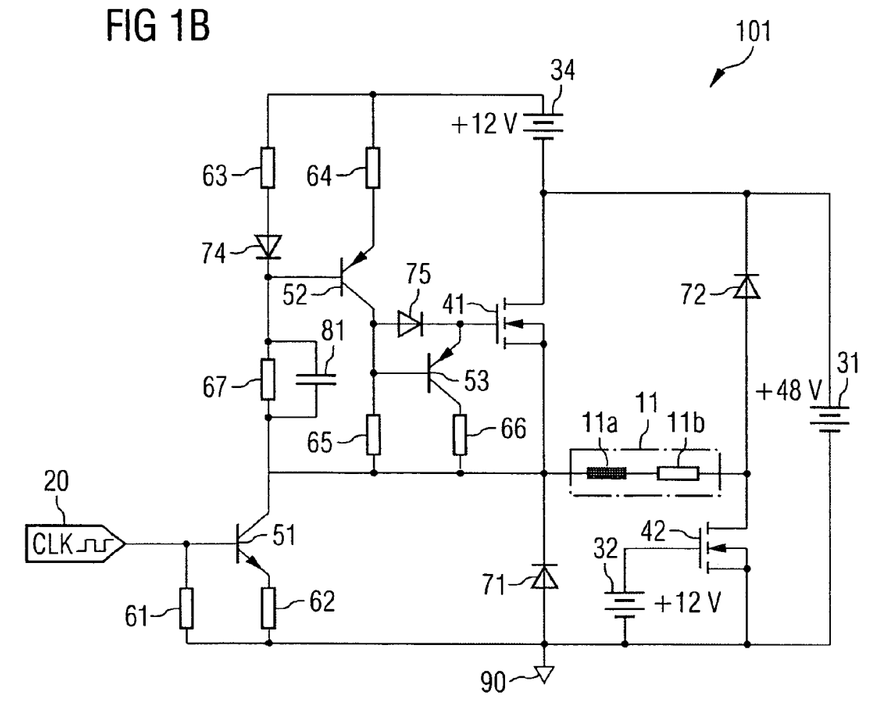
FIG. 1b shows a circuit arrangement according to the invention with auxiliary voltage source for driving an inductive load.

FIG. 1b shows an alternative circuit arrangement 101 likewise employing the features according to the invention. In contrast to the circuit arrangement 100 of FIG. 1a, however, there is no bootstrap capacitor 80 and diode 73. Instead, an auxiliary voltage source 34 sitting on top of the potential of the supply voltage source 31 is used. Its basic mode of operation will be known to a person skilled in the art, as explained in connection with FIG. 1. This variant is an obvious solution for quasi-static applications and/or when simultaneously using a plurality of high-side switches.

The inventive implementation of the switching-means transistor(s) as a current source permits the switching times to be very precisely adjusted within wide limits and therefore provides a good compromise between short switching times and low EMC interference levels.

The exemplary embodiments presented should of course only be taken as exemplary illustrations of particularly advantageous embodiments of the circuit arrangement according to the invention. Within the framework of the theory disclosed here, the person skilled in the art will be able to carry out a wide variety of variations, without departing from the essence of the invention. In particular the dimensioning of the individual components must be adapted to suit the relevant application.

The features of the invention disclosed in the above description and in the claims may be relevant both individually and in any combination for the realization of the invention.

We claim:

1. A circuit arrangement for rapidly switching an inductive load, said arrangement comprising:
   a switching transistor implemented as an N-channel MOS power transistor and connected as a high-side switch for connecting a load with a supply voltage,
   controllable switching means for applying a potential exceeding the voltage of the supply voltage source to a gate electrode of the switching transistor, said switching means incorporating at least a first switching-means transistor whose collector current flows at least in part to the gate electrode of the switching transistor during the ON state, said first switching-means transistor is connected as a current source, said first switching-means transistor is part of a current mirror circuit, wherein the current mirror circuit incorporates a first current mirror resistor and a second current mirror resistor each connected to a low voltage source, the first current mirror resistor being connected to the base electrode and the second current mirror resistor being connected to the emitter electrode of the first switching-means transistor.

2. A circuit arrangement according to claim 1, wherein the first switching-means transistor is a pnp transistor.

3. A circuit arrangement according to claim 1, wherein the collector current of the first switching-means transistor flows to the gate electrode of the switching transistor via a diode connected in the flow direction.

4. A circuit arrangement according to claim 1, wherein the ratio of the resistance values of the first current mirror resistor and the second current mirror resistor corresponds to approximately 100:1.

5. A circuit arrangement according to claim 1, wherein an input current of the current mirror circuit is controllable by means of a second switching-means transistor connected as a current source and clocked by a control signal.

6. A circuit arrangement according to claim 5, wherein the input current of the current mirror flows to the latter via an RC element comprising an RC element resistor and a parallel-connected RC element capacitor.

7. A circuit arrangement according to claim 6, wherein the time constant of the RC element is so designed that the RC element-capacitor is not charged significantly during the turn-on time of the switching transistor, but virtually completely charged during its ON time.

8. A circuit arrangement according to claim 1, wherein the current mirror circuit further includes a diode connected in series with the first current mirror resistor and in the flow direction of the current mirror input current.

9. A circuit arrangement according to claim 1, wherein a bootstrap capacitor is provided which is connected to the low voltage source and to the source electrode of the switching transistor.

10. A circuit arrangement according to claim 1, wherein there is provided a bootstrap diode oriented in the forward direction for coupling the voltage of the low voltage source into the current mirror circuit.

11. A circuit arrangement according to claim 1, wherein the low voltage source has an auxiliary voltage source sitting on top of the potential of the supply voltage.

12. A circuit arrangement according to claim 1, further comprising a second switching-means transistor whose emitter electrode is connected to the gate electrode of the switching transistor and whose collector electrode is connected via a leakage resistor to the source electrode of the switching transistor.

13. A circuit arrangement according to claim 12, further comprising a third switching means transistor wherein the base electrode of the third switching-means transistor is connected via a leakage resistor to the source electrode of the switching transistor.

14. A circuit arrangement according to claim 12, wherein the second switching-means transistor is a pnp transistor.

15. A circuit arrangement according to claim 3, further comprising a second switching-means transistor whose emitter electrode is connected to the gate electrode of the switching transistor and whose collector electrode is connected via a leakage resistor to the source electrode of the switching transistor.

* * * * *